(12) United States Patent
Varnica (10) Patent No.: US 10,797,728 B1
(45) Date of Patent: Oct. 6, 2020

(54) SYSTEMS AND METHODS FOR DIVERSITY BIT-FLIPPING DECODING OF LOW-DENSITY PARITY-CHECK CODES

(71) Applicant: Marvell International Ltd., Hamilton (BM)

(72) Inventor: Nedeljko Varnica, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 176 days.

(21) Appl. No.: 15/981,430

(22) Filed: May 16, 2018

Related U.S. Application Data (63) Continuation of application No. 13/943,061, filed on Jul. 16, 2013, now abandoned.
(60) Provisional application No. 61/675,654, filed on Jul. 25, 2012.

(51) Int. Cl.
*H03M 13/00* (2006.01)
*H03M 13/13* (2006.01)

(52) U.S. Cl.
CPC .................................. *H03M 13/13* (2013.01)

(58) Field of Classification Search
CPC ....... G06F 11/10; H03M 13/00; H03M 13/11; H03M 13/13; H03M 13/15; H03M 13/37
See application file for complete search history.

(56) References Cited

U.S. PATENT DOCUMENTS

| | | | |
|---|---|---|---|
| 4,397,022 A | 8/1983 | Weng et al. | |
| 5,856,987 A | 1/1999 | Holman | |
| 8,127,209 B1 * | 2/2012 | Zhang | H03M 13/1128 714/780 |
| 8,205,134 B2 | 6/2012 | Harrison et al. | |
| 8,219,878 B1 * | 7/2012 | Varnica | H03M 13/1142 714/758 |
| 8,689,084 B1 * | 4/2014 | Tai | H03M 13/112 714/24 |
| 2005/0193320 A1 * | 9/2005 | Varnica | H03M 13/1111 714/800 |
| 2008/0282129 A1 * | 11/2008 | Blanksby | H03M 13/1117 714/758 |
| 2009/0164874 A1 | 6/2009 | O'Neill et al. | |
| 2009/0222711 A1 * | 9/2009 | Belogolovy | H03M 13/1111 714/780 |
| 2010/0042906 A1 * | 2/2010 | Gunnam | H03M 13/1111 714/780 |
| 2010/0088575 A1 | 4/2010 | Sharon et al. | |
| 2010/0192043 A1 * | 7/2010 | Alrod | H03M 13/1111 714/763 |

(Continued)

*Primary Examiner* — Albert Decady
*Assistant Examiner* — Enamul M Kabir (57) ABSTRACT

Methods and systems are provided for decoding LDPC codewords or blocks of codewords using a second set of parameters if decoding the codewords or blocks of codewords fails using a first set of parameters. An LDPC codeword may be decoded using a first decoding technique to produce a first decoding output using a first parameter. The first parameter may be altered to generate a second parameter to be used in a second decoding technique. The LDPC codeword may be decoded using the second decoding technique to produce a second decoding output. A syndrome weight of the first decoding output may be compared to a syndrome weight of the second decoding output and one of the first decoding output or the second decoding output may be selected based on which of the first decoding output or the second decoding output has a lower error.

20 Claims, 6 Drawing Sheets

(56) References Cited

U.S. PATENT DOCUMENTS

| | | |
|---|---|---|
| 2011/0087933 A1* | 4/2011 | Varnica ................ H03M 13/112 |
| | | 714/704 |
| 2011/0219284 A1 | 9/2011 | Uchikawa et al. |
| 2011/0252286 A1* | 10/2011 | Li ...................... H03M 13/1114 |
| | | 714/755 |
| 2012/0054576 A1 | 3/2012 | Gross et al. |
| 2012/0119928 A1 | 5/2012 | Yang |
| 2012/0131627 A1 | 5/2012 | Chittella |
| 2012/0198314 A1 | 8/2012 | Yang et al. |
| 2012/0297267 A1 | 11/2012 | Chinnici et al. |
| 2013/0031447 A1* | 1/2013 | Sharon ............... H03M 13/1128 |
| | | 714/785 |
| 2013/0073928 A1 | 3/2013 | Anholt et al. |
| 2013/0097475 A1 | 4/2013 | Wang et al. |

* cited by examiner

SYSTEMS AND METHODS FOR DIVERSITY BIT-FLIPPING DECODING OF LOW-DENSITY PARITY-CHECK CODES

CROSS REFERENCE TO RELATED APPLICATION

This application is a continuation of U.S. patent application Ser. No. 13/943,061, filed Jul. 16, 2013, which claims the benefit under 35 U.S.C. § 119(e) of U.S. Provisional Application No. 61/675,654, filed Jul. 25, 2012, which is are hereby incorporated by reference herein in their entireties.

FIELD OF USE

The present disclosure relates generally to error correcting systems and methods, and more particularly, systems and methods for iteratively decoding data encoded with a low-density parity check (LDPC) encoder.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Hard decoding LDPC algorithms typically decide whether to flip a bit or symbol based on whether a given number of checks are unsatisfied. LDPC implementations typically use a single decoder with single set of parameters.

SUMMARY

In accordance with the principles of the present disclosure, methods and apparatuses are provided for decoding LDPC codewords or blocks of codewords using a second set of parameters if decoding the codewords or blocks of codewords fails using a first set of parameters.

In some implementations, an LDPC codeword may be decoded using a first decoding technique to produce a first decoding output. The first decoding technique may use a first parameter. The first parameter may be altered to generate a second parameter to be used in a second decoding technique. The LDPC codeword may be decoded using the second decoding technique to produce a second decoding output. A syndrome weight of the first decoding output may be compared to a syndrome weight of the second decoding output. One of the first decoding output or the second decoding output may be selected based on the comparison. It may be determined which of the first decoding output or the second decoding output has a lower error based on the comparison.

The LDPC codeword may include a symbol associated with a plurality of check nodes. Decoding the LDPC codeword using the first decoding technique may include determining a number of unsatisfied check nodes associated with the symbol. A value of the symbol may be changed if the number of unsatisfied check nodes exceeds the first parameter.

In some implementations, decoding the LDPC codeword using the first decoding technique may include determining a number of unsatisfied check nodes associated with the symbol and determining whether the value of the symbol has been previously changed. If the value of the symbol has been previously changed, the value of the symbol may be changed if the number of unsatisfied check nodes exceeds the first parameter of the first decoding technique. If the value of the symbol has not been previously changed, the value of the symbol may be changed if the number of unsatisfied check nodes exceeds a third parameter of the first decoding technique.

In some implementations, altering the first parameter to generate the second parameter used in the second decoding technique may include altering the first parameter such that the first decoding technique and the second decoding technique correct for different noise realizations.

In some implementations, processing circuitry may decode an LDPC codeword using a first decoding technique to produce a first decoding output. The first decoding technique may use a first parameter. The processing circuitry may alter the first parameter to generate a second parameter to be used in a second decoding technique. The first decoding technique may decode the LDPC codeword using the second decoding technique to produce a second decoding output and compare a syndrome weight of the first decoding output to a syndrome weight of the second decoding output. The first decoding technique may select one of the first decoding output or the second decoding output based on the comparison. The first decoding technique may determine which of the first decoding output or the second decoding output has a lower error based on the comparison.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

Figure 1A:
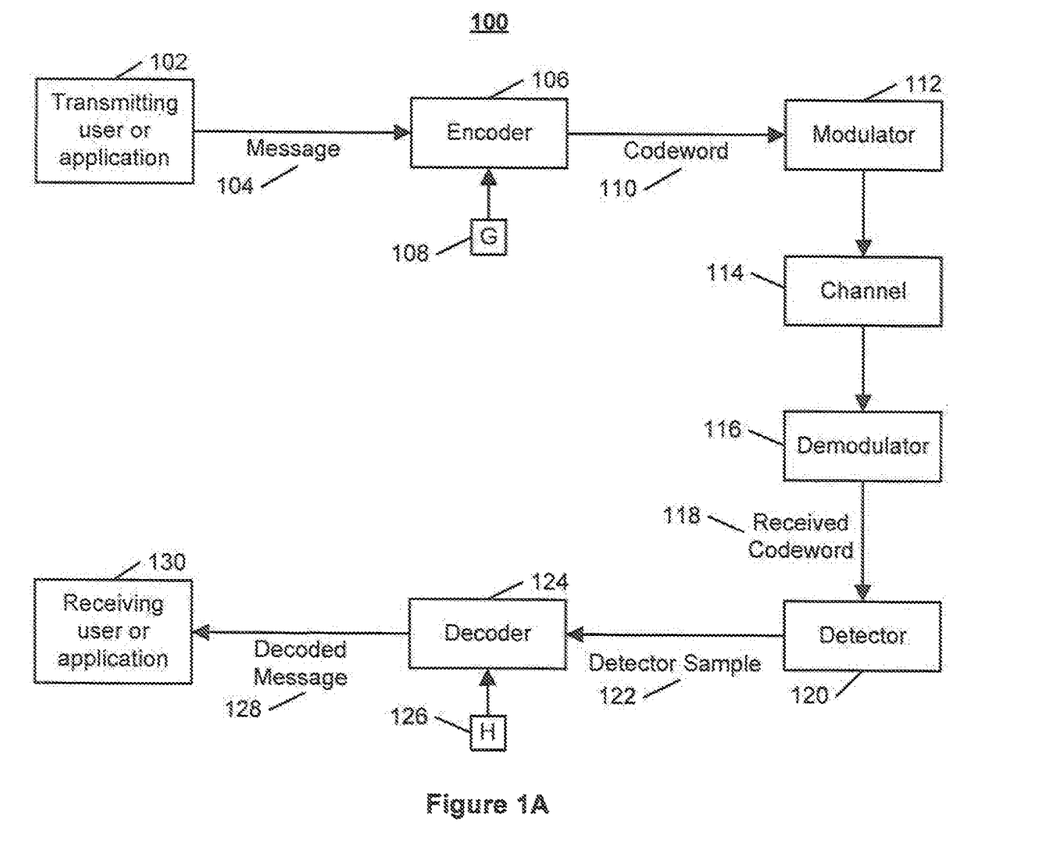
FIG. 1A shows an illustrative communications system employing diversity LDPC decoding in accordance with some arrangements.

FIG. 1A shows an illustrative communications system for diversity LDPC decoding in accordance with some arrangements. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1A). The information produced by the transmitting user or application 102 may correspond to voice information, video information, financial information, or any other type of information that may be represented in digital or analog form, and the data stream produced by the transmitting user or application 102 may be a digital data stream.

The transmitting user or application 102 may segment or otherwise divide the data stream into blocks of a fixed length of k symbols. In particular, a message 104, also referred to as $\underline{m}$, represents one of these blocks. In particular, the message 104 is k symbols in length, where each symbol may be binary data, ternary data, quaternary data, any other suitable type of data, or any suitable combination thereof. An encoder 106 is used to encode the message 104 to produce a codeword 110. In a preferred arrangement, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an arrangement, the encoder 106 produces the codeword 110 from the message 104 using the generator matrix G 108 by the following matrix multiplication $$\underline{c} = G\underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes or is stored on before being recovered at a demodulator 116. For example, the channel 114 may be a storage channel that represents a storage medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which is an estimate of the original data message 104. The detector 120 samples each symbol in the received codeword 118 and assigns each symbol to a bin based on its value. In some arrangements, the bin is assigned based on a probability distribution. Each symbol sampled by the detector 120 is assigned to one of two or more possible bins, or states. Rules for assigning the symbols into one of two bins or states (0 and 1 states) are described in relation to FIG. 1B. Rules for assigning the symbols into one of three bins or states (−1, 0 (i.e., erasure), and 1 states) are described in relation to FIG. 1C.

A decoder 124 receives and iteratively processes the detector sample 122. The detector 120 and the decoder 124 may be two separate processors, or a single processor may be used as both the detector 120 and decoder 124. In general, the decoder 124 comprises control circuitry used to iteratively correct and/or detect errors present in the detector sample 122, for example, due to transmission through the channel 114. In some arrangements, the decoder 124 uses the parity check matrix H 126 and a decoding algorithm to produce a decoded message 128. In general, LDPC decoding can be described using a mathematical vector model $Hc=\vec{0}$, in which c is a binary string of length n and H is the parity check matrix H 126, which is a low-density, sparse n×k matrix, wherein, as above, n is the number of symbols in the codeword and k is the number of symbols in the message. The model is satisfied only when the string c is the codeword $\underline{c}$ 110. The parity check matrix H 126 is not necessarily unique, and may be chosen to be computationally convenient and/or to decrease the number of errors generated by the decoding algorithm of the decoder 124.

The iterative decoding algorithm used by the decoder 124 involves processing a detector sample 122 by changing or flipping symbols in the detector sample 122 based on whether checks of the symbol are satisfied or unsatisfied and based on whether the symbol has been changed or flipped before. As used herein, symbols are "flipped" if they can alternate between two possible values, e.g., 0 and 1. As used herein, symbols are "changed" if they can alternate between two or more possible values, e.g., between 0 and 1 or between −1, 0 (erasure), and 1.

After processing, each symbol in the decoded message 128 should be assigned as one of the valid states (e.g., one of two binary states in the binary example). When input into the model $Hc=\vec{0}$ as c, the decoded message 128 satisfies the model. Suitable algorithms for performing the decoding are described in relation to FIG. 2A through FIG. 6B.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 1B:
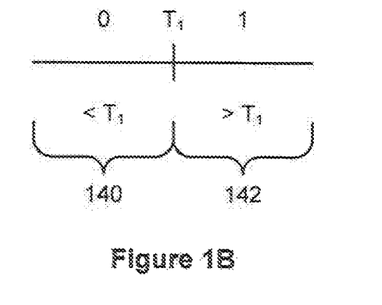
FIG. 1B shows an illustration of processing rules for assigning hard decisions in a one-read implementation of the detector of FIG. 1A in accordance with some arrangements.

FIG. 1B shows an illustration of processing rules for assigning hard decisions at the detector of FIG. 1A in accordance with one-read arrangements. The detector 120 accesses each symbol of the received codeword 118 stored in memory in order to determine and/or store an input state of each symbol. In FIG. 1B, two input states are shown: 0 and 1. These states correspond to the two bins 140 and 142 shown in FIG. 1B. To determine to which bin the symbol should be assigned, the actual received value is compared a threshold $T_1$. These thresholds may be predetermined.

As an example, to determine the input state of a given symbol stored in a flash memory storage device, the memory cell in which the received value of the symbol is stored is read once. In particular, the detector 120 reads the memory cell and compares the charge stored in that cell to a first threshold $T_1$. If the stored charge is less than $T_1$, the stored charge of the symbol falls into the left region 140, and the detector 120 stores a value of 0 as the input state of that symbol. If the charge is greater than $T_1$, the stored charge of the symbol falls into the right region 142, and the detector 120 stores a value of 1 as the input state of that symbol. The input states determined for the detector sample 122 are stored in memory as variable nodes or symbols of the sampled codeword. This memory is termed the "hard decision memory", which may be in a different memory location from the memory location of the received codeword 118.

Figure 1C:
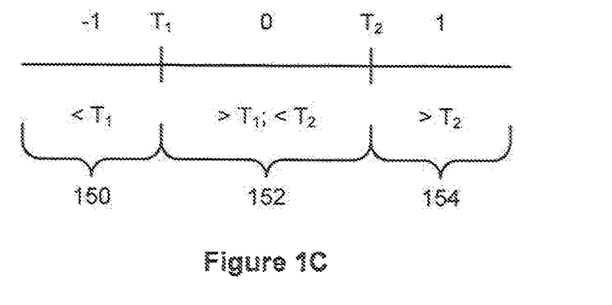
FIG. 1C shows an illustration of processing rules for assigning hard decisions and erasures in a two-read implementation of the detector of FIG. 1A in accordance with some arrangements.

FIG. 1C shows an illustration of processing rules for assigning hard decisions and erasures at the detector of FIG. 1A in accordance with two-read arrangements. The detector 120 accesses each symbol of the received codeword 118 stored in memory in order to determine and/or store an input state of each symbol. In FIG. 1C, three input states are shown: −1, 0 (i.e., "erased"), and 1. These states correspond to the three bins 150, 152, and 154 shown in FIG. 1C. To determine to which bin the symbol should be assigned, the actual received value is compared to two thresholds $T_1$ and $T_2$. These thresholds may be predetermined.

As an example, to determine the input state of a given symbol stored in a flash memory storage device, the memory cell in which the received value of the symbol is stored may be read once or twice. First, the decoder 124 reads the memory cell and compares the charge stored in that cell to a first threshold $T_1$. If the stored charge is less than $T_1$, the stored charge of the symbol falls into the leftmost region 150 and the detector 120 stores a value of −1 as the input state of that symbol. If the charge is greater than $T_1$, the detector 120 reads the memory cell a second time and compares the stored charge to a second threshold $T_2$. If the stored charge is greater than $T_2$, the stored charge of the symbol falls into the rightmost region 154 and the detector 120 stores a value of 1 as the input state of that symbol. Otherwise, it is determined that the stored charge is between $T_1$ and $T_2$; the symbol then falls into the middle region 152 and the detector 120 stores the input state of that symbol as "erased" or 0. The input states determined for the detector sample 122 are stored in memory as variable nodes or symbols of the sampled codeword. This memory is termed the "hard decision memory", which may be in a different memory location from the received codeword 118.

In some arrangements, each symbol is assigned to one of more than three states. For example, there may be one or more thresholds between $T_1$ and $T_2$, and the erased state may be separated into "high erase" and "low erase" states; "high erase", "middle erase", and "low erase" states; and so forth. It is the goal of the decoder 124 to assign a binary value (e.g., 0 or 1) to each of the symbols initially assigned to an erase state. In general, if the thresholds cause too many symbols to be erased, the decoding algorithm may not be able to efficiently or accurately assign values to all of the erased symbols. On the other hand, if too few symbols are erased, the original assignments of the symbols may be too error prone and hinder the decoder 124. Thus, the two or more thresholds may be optimized based on the received codeword 118.

Figure 2A:
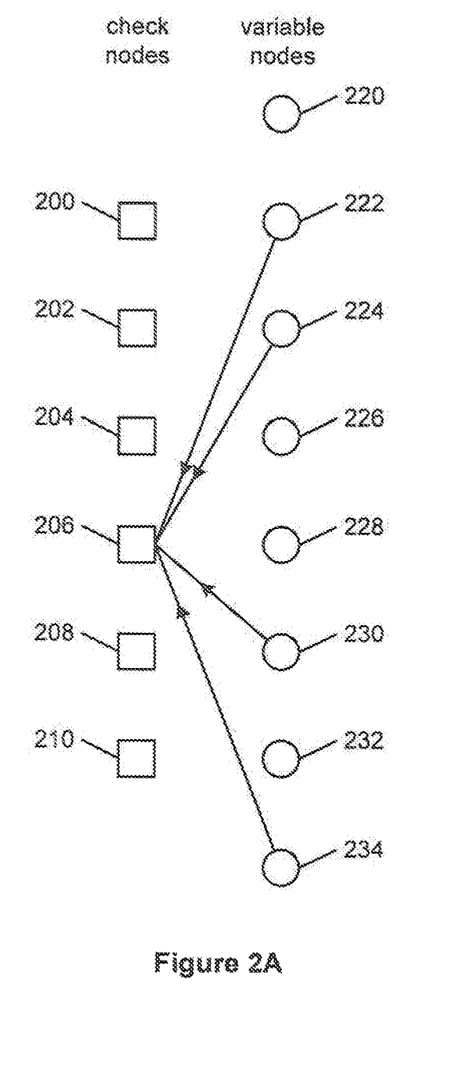
FIGS. 2A and 2B show a graphical illustration of communications between variable nodes representing symbols of a received codeword and check nodes for decoding the received codeword in accordance with some arrangements.
Figure 2B:
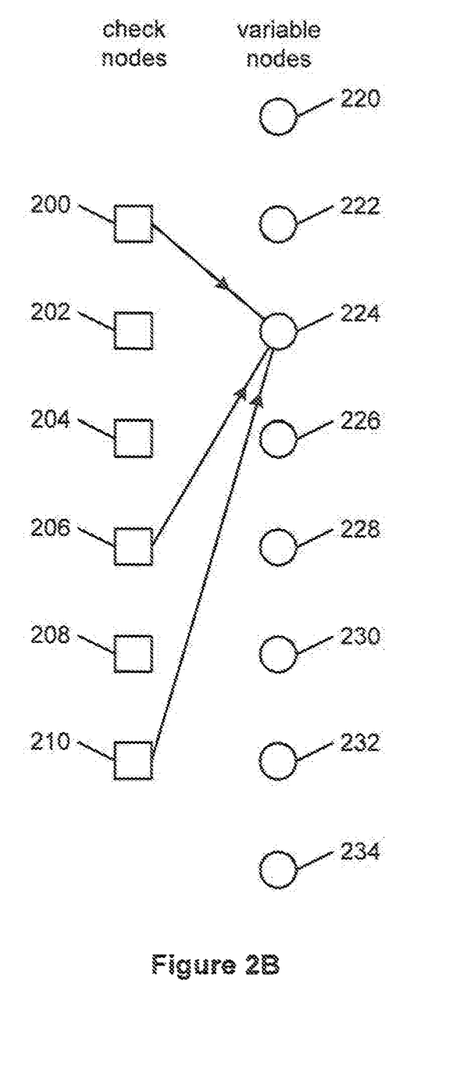

FIGS. 2A and 2B show a graphical illustration of communications between variable nodes 220-234 representing a sampled codeword and check nodes 200-210 for decoding the codeword in accordance with some arrangements.

After the variable nodes 220-234 are assigned input states or values using the detector 120 as described above in relation to FIG. 1B or 1C, a check of the variable nodes is performed by the decoder 124 on a plurality of groups of variable nodes. The decoder 124 uses processing rules of a check algorithm to determine a condition of a group of variable nodes. An indication of the determined condition is stored in syndrome memory at a check node, such as check nodes 200-210. The parity check matrix H 126 (FIG. 1A) identifies which check nodes store indications of the determined conditions for which variable nodes. For example, for the nodes pictured in FIGS. 2A and 2B, the parity check matrix H 126 may be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. The decoder 124 references the parity check matrix H 126 to identify which variable nodes should be checked by a particular check node. For example, for the check node 206, the decoder 124 determines that check node 206 stores the result of a check of variable nodes 222, 224, 230, and 234 (i.e., the second, third, sixth, and eighth variable nodes). Then, the decoder 124 retrieves the values stored in these variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. In reality, the variable node values are retrieved by the decoder 124, which processes the values on behalf of the check node 206 according to the processing rules. From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" of the check node) is stored in syndrome memory, which stores syndrome values or indications of the check nodes. In some cases in the two-read scenario, the processor may receives values of "erased" from the variable nodes and does not identify whether or not the condition of a check node is satisfied. In such cases, the check node may indicate that the check is undetermined. Exemplary processing rules for determining the conditions of the check nodes in a two-read scenario are discussed in U.S. patent application Ser. No. 13/276,525, entitled "SYSTEMS AND METHODS FOR PERFORMING BIT FLIPPING IN AN LDPC DECODER" which is incorporated by reference herein in its entirety.

After the indications or syndrome values for the check nodes 200-210 have been stored in the syndrome memory, the values of the variable nodes 220-234 are updated based on the values of the check nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 (e.g., 0 or 1 for a one-read scenario, or −1, 0, or 1 for a two-read scenario) may be updated. In some arrangements, the state of the variable node 224 may also be determined based in part on whether the variable node 224 had previously been updated, changed, or flipped. Exemplary processing rules for determining the states of a variable node based in part on whether the variable node had been previously updated, changed, or flipped are discussed in U.S. patent application Ser. No. 13/673,371, entitled "METHODOLOGY FOR IMPROVED BIT-FLIPPING DECODER IN 1-READ AND 2-READ SCENARIOS" which is incorporated by reference herein in its entirety.

Figure 3A:
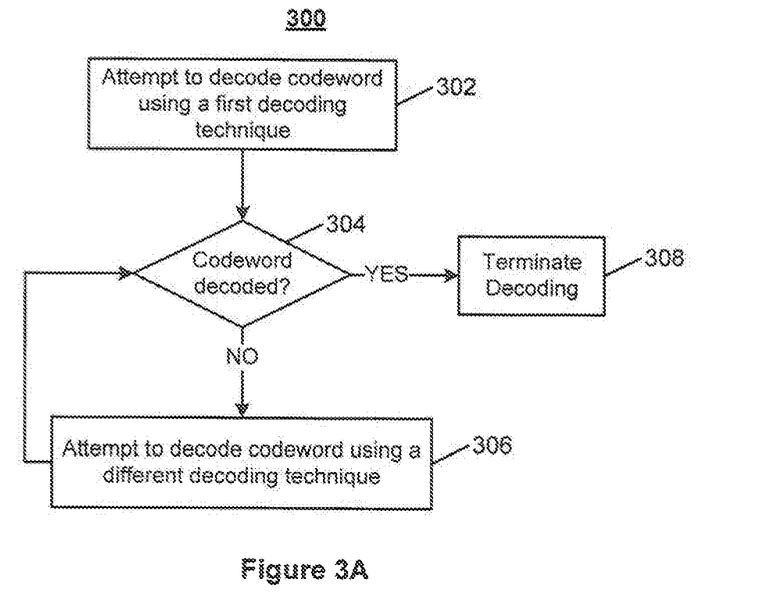
FIG. 3A shows a flow chart of a process of sequential diversity decoding of a received codeword, in accordance with some arrangements.

FIG. 3 shows a flow chart for process 300 for sequential diversity decoding of a received codeword 118. Process 300 involves the use of multiple different decoding techniques. Instructions for the multiple decoding techniques may all be stored on and/or executed by decoder 124. As used herein, a decoder 124 configured to execute multiple different decoding techniques is considered a diversity decoder.

At 302, the decoder 124 attempts to decode the received codeword 118 using a first decoding technique. The first decoding technique may have a first parameter or set of parameters. As used herein, a parameter of a decoding technique defines a rule used in a decoding process, and a parameter can vary from one decoding technique to another decoding technique. Thus, different decoding techniques decode data using different rules that are defined by different sets of parameters; altering one parameter of a first decoding technique results in a second decoding technique that is different from the first. Parameters may include, for example, thresholds for flipping or changing the values of variable nodes, thresholds for changing the conditions of variable nodes, thresholds for assigning decisions (e.g., hard decisions or erasures) when reading symbols, parameters for assigning check nodes to subgroups, etc. Various types of parameters that may be used are described further herein.

In one example, for a standard bit-flipping decoding technique, a parameter may be the threshold of check nodes that need to be "unsatisfied" in order to change a given variable node. This threshold may change over the course of decoding, e.g., from iteration to iteration. A single iteration of a decoding technique may involve updating the check nodes based on the variable node values followed by updating the variable nodes based on the conditions indicated by the check nodes, or updating the variable nodes based on the conditions indicated by the check nodes followed by updating the check nodes based on the variable node values. Other updates may be possible, for example, instantaneous and/or serial update of variable and check nodes. In one example, in the first three iterations of a decoding technique, the threshold to change a given variable node may be a first number n, and during the fourth and subsequent iterations, the threshold may be a second number m. In this case, the set of parameters for the first decoding technique is defined as follows:

$$[n\ n\ n\ m\ m\ \ldots]$$

For example, if the first threshold is 4, and the second threshold is 3, and the maximum number of iterations that may be performed for the first decoding technique is 7, then the set of parameters for this decoding technique is [4 4 4 3 3 3 3]. Other thresholds and number of iterations may be used, and the threshold value may change fewer or more than once over the course of using a decoding technique (e.g., the threshold may be one value for the entire decoding technique, or the threshold may drop twice during the decoding technique, e.g., from 4 to 3 and then from 3 to 2).

In other embodiments, additional or alternative parameters may be used. For example, if a codeword was coded using an irregular LDPC codes, some variable nodes may be checked by one number of check nodes, and other variable nodes may be checked by a different number of check nodes. The number of check nodes that check a given variable node is considered that variable node's degree. In this case, a decoding technique may have one set of bit-changing thresholds for nodes of one degree and a different set of thresholds for nodes of another degree. Each of these thresholds may be considered a decoding technique parameter.

In the case of a decoding technique based in part on prior states, such as the decoding processes described in U.S. patent application Ser. No. 13/673,371, entitled "METHODOLOGY FOR IMPROVED BIT-FLIPPING DECODER IN 1-READ AND 2-READ SCENARIOS," which is incorporated by reference herein in its entirety, different thresholds may be used based on one or more previous state of a variable node. For instance, thresholds may be based on whether or not a variable node has been changed from an original value, whether or not the value of a variable node is different from an original value, whether or not the value of a variable node has been changed in a certain number of previous iterations, etc. In such cases, each threshold for each situation may be considered a parameter.

In the case of a decoding technique in a two or more read scenario, such as the decoding processes described in U.S. patent application Ser. No. 13/276,525, entitled "SYSTEMS AND METHODS FOR PERFORMING BIT FLIPPING IN AN LDPC DECODER," which is incorporated by reference herein in its entirety, various processing rules that take into consideration three or more possible check node conditions may be used to assign values of 0, 1, and one or more erasure states to the variable nodes. For example, if a threshold number of check nodes have a certain condition, the variable node checked by these check nodes may be changed. In this case, each condition may be associated with a particular threshold, which may be considered a parameter of the decoding technique. Furthermore, threshold values may also be used in the checking process of a two or more read scenario. For example, if a threshold number of variable nodes being checked by a check node store a value of "erasure," a condition of E may be stored at the check node. In this case, the threshold to assign a certain condition to a check node may also be considered a parameter of the decoding technique.

After attempting to decode the data using the first decoding technique with the first parameter or set of parameters, the decoder 124 at 304 determines whether the data has been successfully decoded by determining whether the decoding technique has converged so that all the conditions of all of the check nodes are satisfied, or the amount of error remaining in the decoded codeword has been reduced to an acceptable level. If the codeword has been decoded, at 306, the decoder 124 terminates decoding and the decoded message 128 is passed to the receiving user or application 130.

If the first decoding technique has not converged, at 306, the decoder 124 attempts to decode the codeword using a second decoding technique that is different from the first. For example, the second decoding technique may be a different type of decoding technique, or the second decoding technique may have at least one parameter that has been altered from a corresponding parameter in the first decoding technique. Given the above exemplary standard bit-flipping decoding technique with the set of threshold parameters [4 4 4 3 3 3 3], the second decoding technique may use a second threshold of 3 rather than 4, giving the following set of thresholds for the second decoding technique: [4 4 3 3 3 3 3].

To switch from a first decoding technique using one set of parameters to a second decoding technique using a second set of parameters, the decoder 124 may have a register representing the parameters that can be varied over techniques; this register is accessed by the decoder 124 when it executes a decoding technique. After a first decoding technique, one or more of the values in this register can be changed so that a subsequent decoding technique that has been altered from the first (because it is based on a different set of parameters) is executed.

At 304, after the attempt to decode the codeword using the second decoder, the decoder 124 again determines whether the codeword has been decoded as described above. If the codeword has been decoded, the decoder 124 terminates decoding at 308; if the codeword has not been decoded, the decoder 124 attempts to decode the codeword using yet another different decoding technique at 306.

In some embodiments, the decoder 124 may have a maximum number of decoding techniques available, and if all of the decoding techniques have been attempted without successfully decoding the codeword, the decoder 124 may declare an error. The decoder 124 may alternatively or additionally select the best output obtained through the decoding technique 300. In some embodiments, the decoder 124 may combine parts of codewords resulting from two or more decoding techniques and output the combined codeword.

In some embodiments, the parameters of the available decoding techniques and the order in which the decoding techniques are attempted are fixed, so that the decoder 124 always attempts to decode the codeword using a predetermined first decoding technique, and, if it fails, attempts to decode the codeword using a predetermined second decoding technique, and so forth. The selection of the decoding techniques and the order in which they are attempted maybe optimized and then programmed in firmware of the decoder 124.

In other embodiments, the order of the available decoding techniques may not be predetermined, and the decoder 124 analyzes of one or more prior decoding attempts and select the next decoding technique based on the analysis. For example, if a particular decoding technique obtained a codeword with many errors, the decoder 124 may select a different type of decoding technique or a decoding technique with very different parameters, whereas if a particular decoding technique obtained a codeword with few errors, the decoder 124 may select a similar decoding technique with only a minor change to the parameters. The decoder 124 may consider the iteration number at which a particular decoding technique fails or the syndrome weight of the output of the decoding technique when selecting the next decoding technique.

Figure 3B:
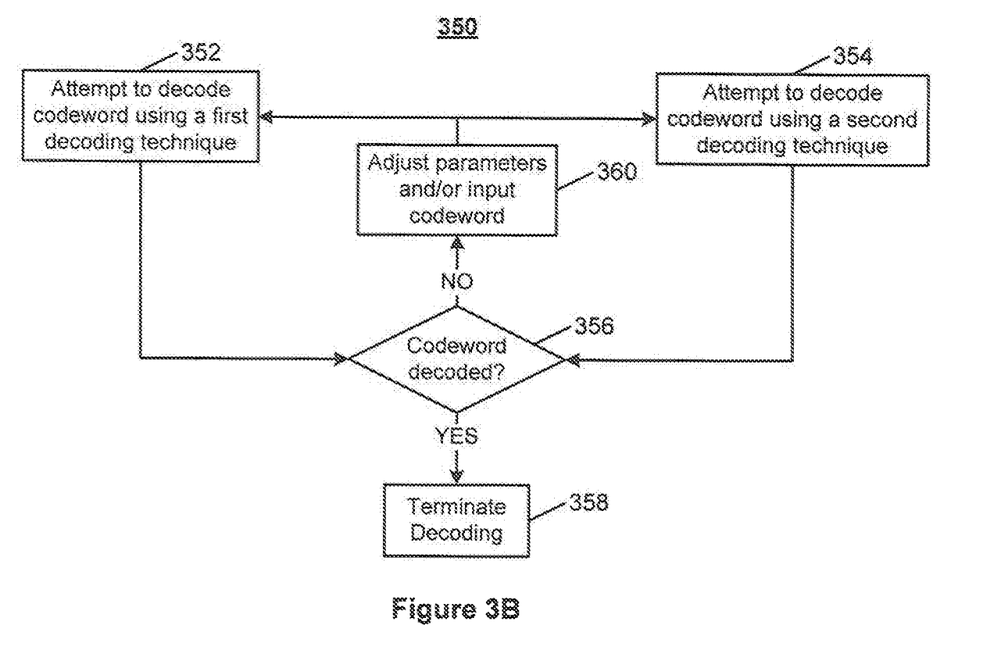
FIG. 3B shows a flow chart of a process of parallel diversity decoding of a received codeword, in accordance with some arrangements.

FIG. 3B shows a flow chart of a process 350 of parallel diversity decoding of a received codeword 118. At 352, the decoder 124 attempts to decode the received codeword 118 using a first decoding technique. Simultaneously, at 354, the decoder 124 attempts to decode the codeword 118 using a second decoding technique that is different from the first. As in process 300, the decoding techniques may be the same type of techniques with different parameters, or they may be different techniques. The first and/or second decoding techniques may be similar to any of the previously described decoding techniques. In some embodiments, more than two different decoding techniques may be executed simultaneously.

At 356, the decoder 124 determines whether one or both of the decoding techniques have successfully decoded the codeword. This may be similar to step 304 of FIG. 3A, discussed above. If the codeword has been successfully decoded, the decoder 124 terminates the decoding at 358. If the codeword has not been decoded, at 360, the decoder 124 may adjust one or more decoder parameters and/or the input codeword before re-attempting to decode the codeword.

For example, the detector 124 may compare the original received codeword 118 to the outcome of one or more previous attempts to decode the codeword. If a previous attempt has more unsatisfied check nodes than the original data (i.e., the previous attempt has a higher syndrome weight), then the decoder 124 may not use the previous attempt as an input to another decoding technique. However, if a previous attempt has a lower syndrome weight than the original data, or a syndrome weight that is lower than another threshold, this may indicate that the attempt is on the right track towards recovering the original keyword, and the result of the previous attempt may be used as input to another decoding technique.

Figure 6A:
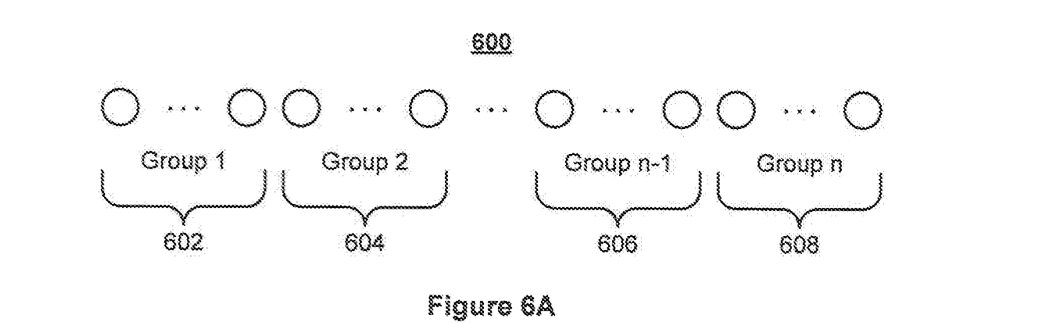
FIG. 6A shows a graphical illustration of a codeword comprising multiple blocks of variable nodes that are decoded using different decoding techniques in accordance with some arrangements.

In some embodiments, the results of two or more previous decoding techniques and/or the original may be combined. For example, the input to another decoding technique may be made up of some variable nodes from one previous attempt and other variable nodes from a second previous attempt, or other variable nodes from the original codeword. This combining may be used, for example, when a codeword has multiple distinct groups of variable nodes, as in an irregular codeword where some variable nodes of one degree are selected from one attempt and variable nodes of a different degree are selected from another attempt. A codeword may also be broken into groups based on known or possible noise characteristics; this is described further in relation to FIG. 6.

At 360, one or more decoding technique parameters may be adjusted for the next decoding attempt(s). In some embodiments, the first decoding technique and the second decoding technique may be selected to correct for different instances of noise, or noise realizations. For example, the parameters of the first decoding technique may be optimized to correct for short error events, and the parameters of the second decoding technique may be optimized to correct for long error events. In this case, even if neither decoding technique successfully decodes the codeword, comparing their performance may provide information on the noise realization of the received codeword 118 and guide the parameter selection for subsequent decoding techniques. For example, if the first decoding technique optimized to correct for short error events performs significantly better than the second decoding technique, the decoding techniques used for the next attempts may be selected to address short error events; for example, the parameters may be generated by slightly varying one or more parameters of the first decoding technique. In some embodiments, the same decoding technique parameters are used as the previous attempt, but with a different input as discussed above.

As in process 300, process 350 may have a maximum number of decoding techniques available and/or a set maximum number of attempts, and if either maximum is reached without successfully decoding the codeword, the decoder 124 may declare an error. The decoder 124 may alternatively or additionally select the best output obtained through the decoding process 350. In some embodiments, the decoder 124 may combine parts of codewords resulting from two or more decoding techniques and output the combined codeword.

Figure 4:
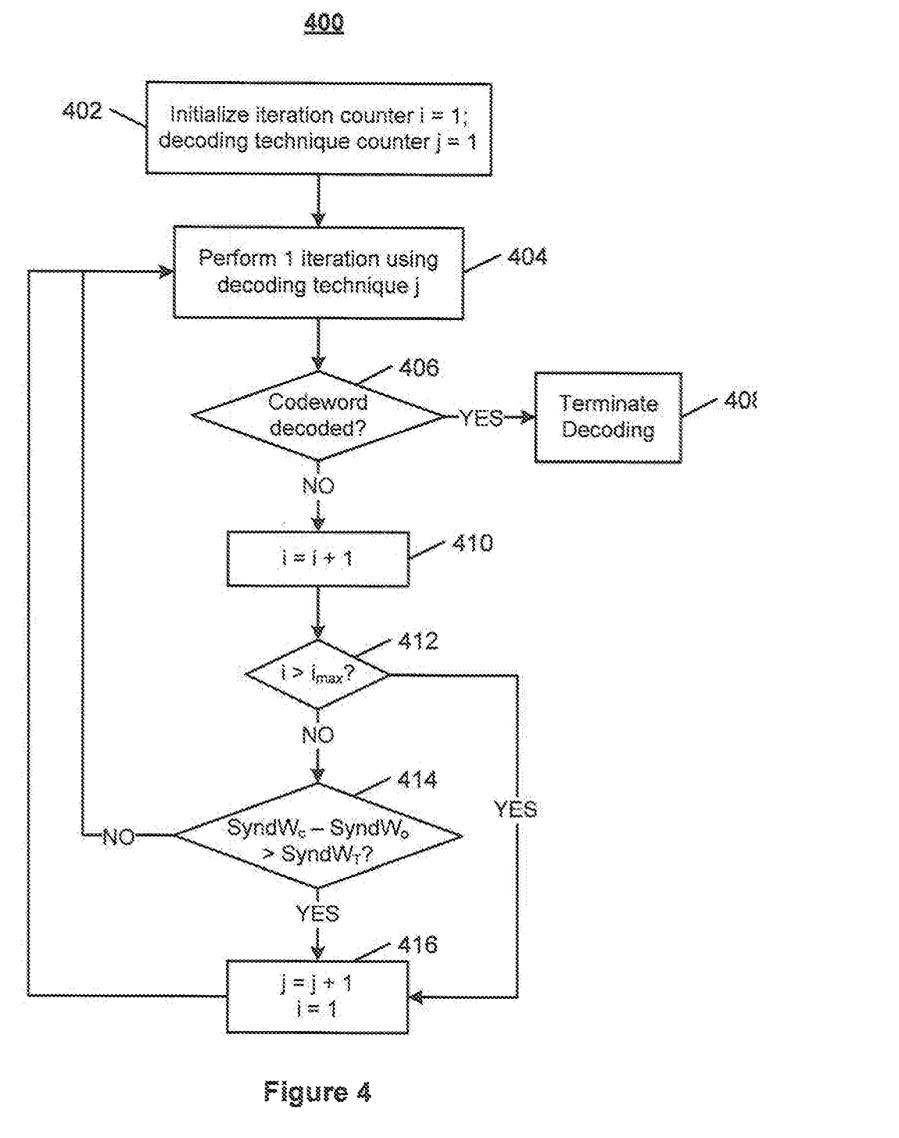
FIG. 4 shows a flow chart of a particular process of sequential diversity decoding of a received codeword, in accordance with some arrangements.

FIG. 4 shows a flow chart of a particular process 400 of sequential diversity decoding of a received codeword. At 402, the decoder 124 initializes two counters: an iteration counter i and a decoding technique counter j. The iteration counter i tracks the current iteration of a particular iterative decoding technique. The decoding technique counter j tracks the decoding technique being used.

At 404, the decoder 124 performs one iteration of decoding technique j, which in this case is the first decoding technique. A single decoding technique iteration may involve, for example, 1.) updating the check nodes based on the variable node values followed by updating the variable nodes based on the conditions indicated by the check nodes, 2.) updating the variable nodes based on the conditions indicated by the check nodes followed by updating the check nodes based on the variable node values, or 3.) updating only the check nodes based on the variable node values. If the second or third type of iteration is used, an initial check of the variable nodes may be performed before the first iteration is performed at 404. Other scheduling techniques may also be possible, such as serial updates of check and variable nodes.

At 406, the decoder 124 determines whether the codeword has been decoded. If the second type of iteration was used, determining whether the codeword has been decoded involves analyzing the updated check nodes, e.g., identifying whether all of the check nodes are satisfied, which indicates that the codeword has been successfully decoded, or identifying whether all but a number of check nodes below a threshold have been satisfied, indicating that the error has been reduced to an adequate level. If the first or third type of iteration was used, determining whether the codeword has been decoded involves performing a check process and then analyzing the updated check nodes.

If the decoder 124 determines at 406 that the codeword has been decoded, decoding is terminated at 408. If the decoder 124 determines at 406 that the codeword has not been decoded, the decoder 124 increments the iteration counter at 410 and determines whether the iteration counter has exceeded a maximum number of iterations $i_{max}$ at 412. The maximum number of iterations $i_{max}$ may be fixed for all decoders, or may vary by decoder. In some embodiments, the maximum number of iterations $i_{max}$ may be considered a decoding technique parameter.

If the maximum number of decoding techniques has been exceeded, the decoding technique counter is incremented at 416, and the iteration counter is reset to 1. The first iteration of the next decoding technique is then performed at 404.

If the maximum number of iterations $i_{max}$ has not been exceeded, the decoder 124 determines at 414 whether decoding technique j should be terminated early, i.e., before the maximum number of iterations $i_{max}$ has been reached. For example, the decoder 124 may subtract the the original syndrome weight of the received codeword 118 $SyndW_o$ from current syndrome weight $SyndW_c$ and compare the result to a threshold $SyndW_T$. The threshold $SyndW_T$ may be fixed for all decoding techniques, or it may vary by decoding technique. Furthermore, the threshold $SyndW_T$ may vary by iteration number. If the change in syndrome weight has exceeded the threshold, then at 416, the decoding technique counter j is incremented and the iteration counter reset. If the change in syndrome weight has not exceeded the threshold, then another iteration is performed at 404.

Figure 5:
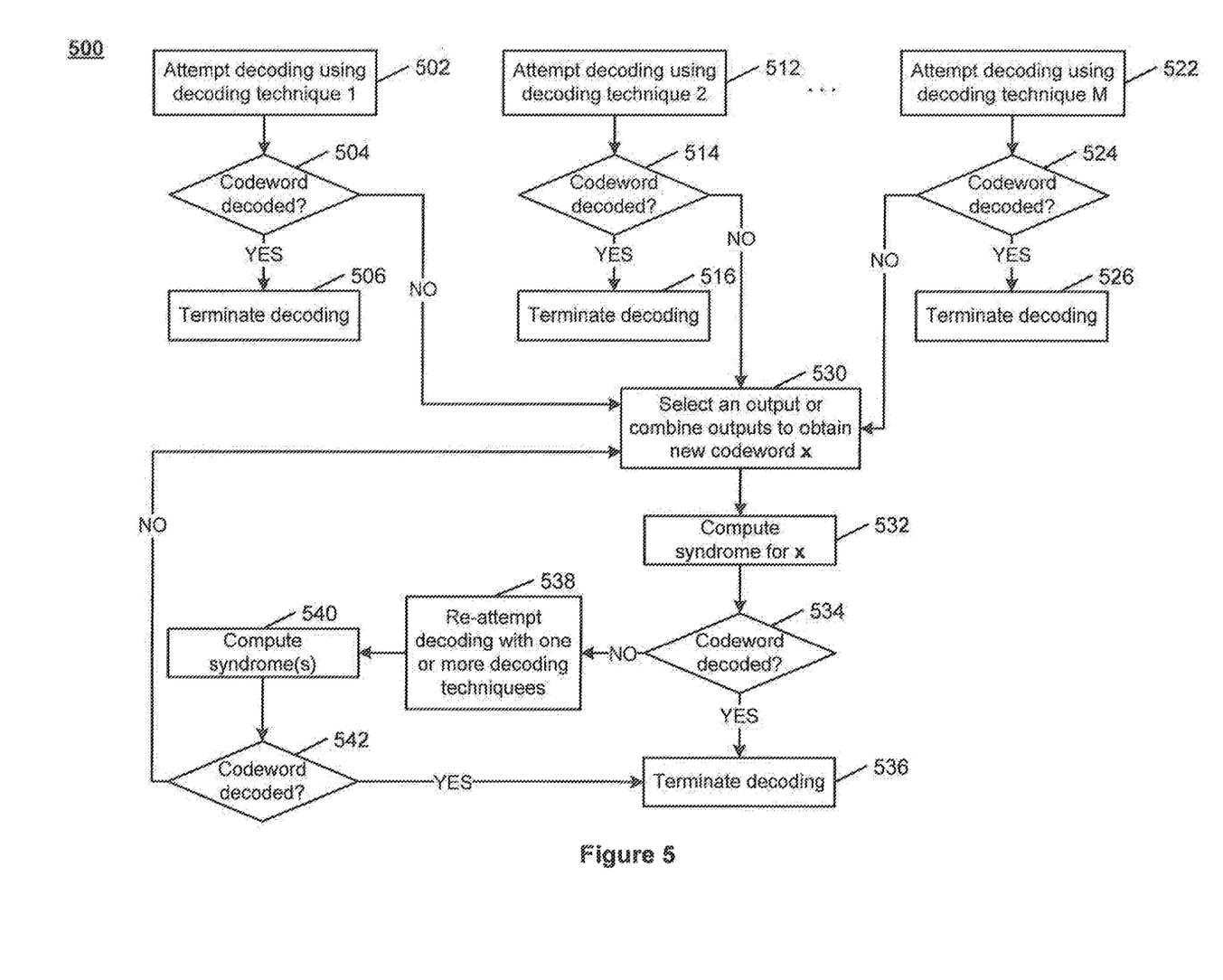
FIG. 5 shows a flow chart of a particular process of parallel diversity decoding of a received codeword, in accordance with some arrangements.

FIG. 5 shows a flow chart of a particular process 500 of parallel diversity decoding of a received codeword. Process 500 includes M decoding techniques 502-506, 512-516, and 522-526 executing in parallel, and a combining/decision making procedure 530-542. While three decoding techniques are drawn in FIG. 5, M may be equal to two or more.

In the first decoding technique, the decoder 124 attempts to decode the codeword using a first decoding technique (decoding technique 1) at 502. Any decoding technique, including any of the iterative bit-flipping or bit-changing techniques described herein, may be used. At 504, the decoder 124 determines whether the codeword has been decoded; this determination may be similar to the determination performed at 406 as described in relation to FIG. 4. For an iterative decoding technique, the decoder 124 may determine whether the codeword was decoded after every iteration, after certain iterations, or after decoding technique 1 has been completed. If the codeword has been decoded, at 506 all decoding (by all decoding techniques) is terminated. If the codeword has not been decoded, the output of decoding technique 1 is used in combining/decision making procedure 530-542, discussed below.

As shown at 512-526, M other decoding procedures are executed simultaneously. Three exemplary decoding procedures are drawn in FIG. 5. The second decoding procedure uses a second decoding technique (decoding technique 2) that is different from decoding procedure 1; the $M^{th}$ decoding procedure uses a third decoding technique (decoding technique M) that is different from both decoding procedure 1 and decoding procedure 2.

If none of the M decoding techniques successfully decodes the codeword, at 530, the decoder 124 obtains a new codeword x for use in continued decoding. The new codeword x may be the original received codeword 118, an outputs of one of the M decoding techniques, or a combination of the original received codeword and/or one or more outputs of the M decoding techniques. In some embodiments, one or more intermediate results of one or more decoding techniques may also be used as codeword x or as a portion of codeword x.

In some embodiments, obtaining the new codeword x may involve combining the best results for multiple groups of variable nodes. For example, for an irregular codeword having at least two sets of variable nodes of different degrees, the variable nodes of one degree may be selected from one attempt or the original data, and variable nodes of a different degree may be selected from another attempt or the original data. As another example, if a codeword is broken into groups based on known or possible noise characteristics, one or more of these groups may be selected from one decoding technique result and combined with one or more groups from one or more other decoding technique results and/or the original data. When combining variable node values to obtain codeword x, the groups need not be pre-defined as in the previous two examples. For example, the decoder 124 may select the result with the lowest syndrome weight as a starting point, and replace values of any variable nodes associated with unsatisfied check nodes with the values of corresponding variable nodes from the original codeword 118 or from another decoding technique result.

After the codeword x has been obtained, the decoder 124 computes the syndrome for the new codeword x at 532. At 534, the decoder 124 determines from the computed syndrome values whether the new codeword x is decoded; if so, at 536, the decoder 124 terminates the decoding process 500. If the codeword x has not been decoded, the decoder 124 re-attempts decoding with one or more of the M decoding techniques at 538. Re-attempting the decoding technique(s) may involve running a single iteration of one or more of the previously used decoding techniques, running multiple iterations of one or more of the previously used decoding techniques, and/or running one or more iterations of one or more new or modified decoding techniques, as described in relation to 360 of FIG. 3B.

At 540, the decoder 124 computes the syndrome for the outputs of each of the decoding re-attempts. At 542, the decoder 124 determines from the computed syndrome values whether any of the re-attempts have successfully decoded the codeword; if so, at 536, the decoder 124 terminates the decoding process 500. If the codeword has is not decoded, at 530, the decoder 124 may again obtain a codeword for use in further decoding. At some point, even if the codeword has not been decoded, the process 500 may automatically terminate and return the best codeword obtained or declare an error.

FIG. 6A shows a graphical illustration of a codeword 600 made up of multiple groups of variable nodes 606-608 that can be decoded using different decoding techniques. For example, if the decoder 124 receives information that one portion of the codeword 600 experienced one type of noise during transmission and another portion experienced a different type of noise, the decoder 124 may select decoding techniques designed to address the respective types of noise for decoding the respective portions. A codeword may have experience more than two types of noise, and the portions that experienced one type of noise need not be contiguous. For example, if the first and third groups both experience the same type of noise, the same technique may be used for the first and third groups.

In some embodiments, even if knowledge of the noise is not known, the decoder 124 may split a keyword into two or more groups for decoding. In some embodiments, each of multiple decoding techniques may assign variable nodes to groups in different ways (e.g., a first decoding technique may assign the first half of the variable nodes to a first and the second half to a second group; and a second decoding technique may assign the first third of the variable nodes to a first group, the second third to a second group, and the remaining third to a third group). Furthermore, multiple decoding techniques may use the same group assignments, but use different decoding techniques on the groups. These assignments may be arbitrary, or they may be based on channel information, information learned from decoding other codewords, and/or other information.

When a codeword is split into multiple groups to be processed according to different decoding techniques, each of these decoding techniques may be performed within a single iteration of the decoder 124. In this case, the process that includes the multiple decoding techniques corresponding to the groups of nodes may be considered a diversity decoding process. In a diversity decoding process, rules for a first decoding technique based on a first set of parameters may be used when the decoder 124 updates variable nodes for a first portion of the data, and rules for a second decoding technique based on a second set of parameters may be used when the decoder 124 updates variable nodes for a second portion of the data. In some embodiments, different sets of check nodes may be assigned conditions based on different corresponding techniques.

Figure 6B:
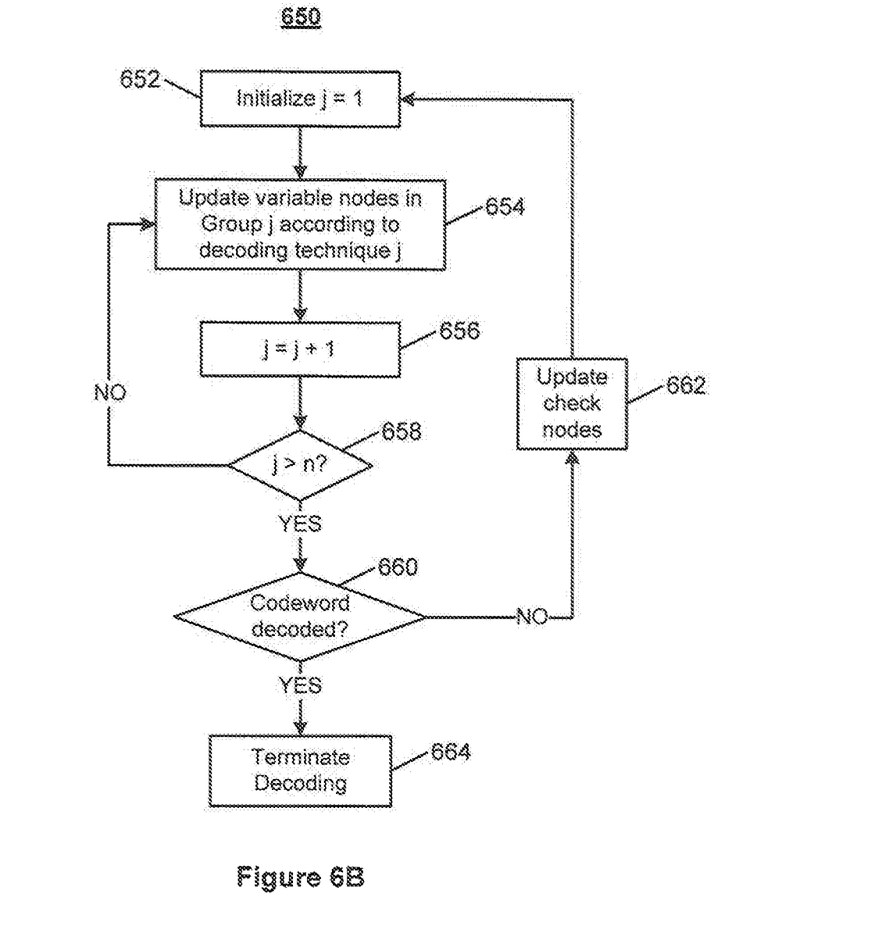
FIG. 6B shows a flow chart of a process of decoding the codeword illustrated in FIG. 6A using a diversity decoding technique, in accordance with some arrangements.

FIG. 6B shows a flow chart of a process 650 of decoding the codeword 600 using a diversity decoding process. The diversity decoding process includes n decoding techniques; at least one of the decoding techniques is different from another one of the decoding techniques. At 652, the decoder 124 initializes a decoding technique counter j. At 654, the decoder 124 updates all of the variable nodes in the first group (Group j, j=1) according to the rules of decoding technique j. The check nodes may have already been assigned conditions based on the original codeword 118.

At 656, the decoder 124 increments the decoding technique counter j, and at 658, the decoder 124 compares the decoding technique counter j to the number of decoding techniques n. If j is not greater than n, not all of the variable nodes have been processed, and at 654, the variable nodes in the next group are updated according to the next decoding technique. If n is greater than j, then at 660, the decoder 124 determines whether the codeword has been decoded. If the codeword has been decoded, at 664, decoding is terminated. If the codeword has not been decoded, at 662, the check nodes are updated. In some embodiments, the check nodes are broken into multiple groups, and a similar sequence as steps 654-658 may be used to iterate through the groups of check nodes.

After the check nodes have been updated, the decoding technique counter j is reinitialized at 652, and the variable nodes are again updated. The decoding process 650 may have a maximum number of iterations after which decoding is terminated even if the codeword has not been decoded.

The decoding process 650 may be used as a single decoding technique within any of the processes 300, 350, 400, or 500.

The above described arrangements and embodiments are presented for the purposes of illustration and not of limitation. One or more parts of techniques described above may be performed in a different order (or concurrently) and still achieve desirable results. In addition, the techniques of the disclosure may be implemented in hardware, such as on an application specific integrated circuit (ASIC) or on a field-programmable gate array (FPGA). The techniques of the disclosure may also be implemented in software, or in a combination of hardware and software.

What is claimed is:

1. A method for decoding an LDPC codeword, the method comprising:
    performing, using a processing circuitry comprising at least one decoder, a first iteration of decoding the LDPC codeword using a first decoding technique comprising first instructions to produce a first decoding output;
    determining, whether the LDPC codeword has been decoded;
    in response to determining that the LDPC codeword has not been decoded:
        calculating a first syndrome weight of the first decoding output;
        computing a difference between the first syndrome weight of the first decoding output and an original syndrome weight of the LDPC codeword;
        comparing the computed difference between the first syndrome weight and the original syndrome weight to a threshold syndrome weight;
        in response to determining that the computed difference between the first syndrome weight and the original syndrome weight is greater than the threshold syndrome weight:
            decoding, using the processing circuitry, the LDPC codeword using a second decoding technique, comprising second instructions different from the first instructions of the first decoding technique, to produce a second decoding output;
        in response to determining that the computed difference between the first syndrome weight and the original syndrome weight is less than the threshold syndrome weight:
            performing a second iteration of decoding the LDPC codeword using the first decoding technique.

2. The method of claim 1, further comprising:
    defining the second decoding technique by modifying a threshold for changing conditions of a plurality of variable nodes associated with the first decoding technique.

3. The method of claim 1, further comprising:
    in response to determining that the LDPC codeword has been decoded, terminating the decoding process.

4. The method of claim 3, wherein determining that the LDPC codeword has been decoded further comprises:
    determining whether every check node associated with the LDPC codeword is satisfied;
    in response to determining that every check node associated with the LDPC codeword is satisfied, determining that the LDPC codeword has been decoded successfully.

5. The method of claim 3, wherein determining that the LDPC codeword has been decoded further comprises:
    determining a number of unsatisfied check nodes associated with the LDPC codeword; and
    in response to determining that the number of unsatisfied check nodes associated with the LDPC codeword is below a predetermined threshold:
        determining that the LDPC codeword has been decoded successfully.

6. The method of claim 1, further comprising:
    in response to determining that the LDPC codeword has not been decoded:
        determining a number of iterations for which the first decoding technique has been performed;
        comparing the number of iterations to a predetermined threshold;
        in response to determining that the number of iterations is greater than the predetermined threshold, decoding the LDPC codeword using the second decoding technique.

7. The method of claim 1, wherein the LDPC codeword comprises a symbol associated with a plurality of check nodes, and wherein the decoding of the LDPC codeword using the first decoding technique comprises:
    determining a number of unsatisfied check nodes associated with the symbol;
    determining whether the value of the LDPC codeword has changed after the first iteration, wherein:
        if the value of the LDPC codeword has changed after the first iteration, changing the value of the LDPC codeword if the number of unsatisfied check nodes exceeds a first parameter of the first iteration of the first decoding technique; and
        if the value of the LDPC codeword has not been changed by the first iteration, changing the value of the LDPC codeword if the number of unsatisfied check nodes exceeds a second parameter of the second iteration of the first decoding technique.

8. The method of claim 1, wherein:
    the LDPC codeword comprises a plurality of symbols, each of the plurality of symbols being associated with a plurality of check nodes;
    decoding a first group of symbols of the plurality of symbols of the LDPC codeword using the first iteration of the first decoding technique; and
    decoding a second group of symbols of the plurality of symbols of the LDPC codeword, different from the first group of signals, using second iteration of the first decoding technique.

9. The method of claim 1, further comprising:
    performing a correction for different noise realizations by the first decoding technique defined and the second decoding technique.

10. The method of claim 1, further comprising:
    modifying the threshold syndrome weight that was used for the first decoding technique and based on the second decoding technique, before the first iteration of the second decoding technique.

11. A system for decoding an LDPC codeword, the system comprising:
    memory configured to store the LDPC codeword and decoding variables relating to the LDPC codeword; and
    processing circuitry configured to:
        perform a first iteration of decoding the LDPC codeword using a first decoding technique comprising first instructions to produce a first decoding output;

determine whether the LDPC codeword has been decoded;
in response to determining that the LDPC codeword has not been decoded:
calculate a first syndrome weight of the first decoding output;
compute a difference between the first syndrome weight of the first decoding output and an original syndrome weight of the LDPC codeword;
compare the computed difference between the first syndrome weight and the original syndrome weight to a threshold syndrome weight;
in response to determining that the computed difference between the first syndrome weight and the original syndrome weight is greater than the threshold syndrome weight:
decode the LDPC codeword using a second decoding technique, comprising second instructions different from the first instructions of the first decoding technique, to produce a second decoding output; and
in response to determining that the computed difference between the first syndrome weight and the original syndrome weight is less than the threshold syndrome weight:
perform a second iteration of decoding the LDPC codeword using the first decoding technique.

12. The system of claim 11, wherein the processing circuitry is further configured to:
define the second decoding technique by modifying a threshold for changing conditions of a plurality of variable nodes associated with the first decoding technique.

13. The system of claim 11, wherein the processing circuitry is further configured to:
in response to determining that the LDPC codeword has been decoded, terminate the decoding process.

14. The system of claim 13, wherein the processing circuitry is further configured, when determining that the LDPC codeword has been decoded, to:
determine whether every check node associated with the LDPC codeword is satisfied;
in response to determining that every check node associated with the LDPC codeword is satisfied, determine that the LDPC codeword is has been decoded successfully.

15. The system of claim 13, wherein the processing circuitry is further configured, when determining that the LDPC codeword has been decoded, to:
determine a number of unsatisfied check nodes associated with the LDPC codeword; and
in response to determining that the number of unsatisfied check nodes associated with the LDPC codeword is below a predetermined threshold:
determine that the LDPC codeword has been decoded successfully.

16. The system of claim 11, wherein the processing circuitry is further configured to:
determine a number of iterations of the first decoding technique performed;
compare the number of iterations to a predetermined threshold;
in response to determining that the number of iterations is greater than the predetermined threshold, decode the LDPC codeword using the second decoding technique.

17. The system of claim 11, wherein the processing circuitry is further configured, when the LDPC codeword comprises a symbol associated with a plurality of check nodes, and wherein the decoding of the LDPC codeword using the first decoding technique, to:
determine a number of unsatisfied check nodes associated with the symbol;
determine whether the value of the LDPC codeword has changed after the first iteration, wherein:
if the value of the LDPC codeword has changed after the first iteration, change the value of the LDPC codeword if the number of unsatisfied check nodes exceeds a first parameter of the first iteration of the first decoding technique; and
if the value of the LDPC codeword has not been changed by the first iteration, change the value of the LDPC codeword if the number of unsatisfied check nodes exceeds a second parameter of the second iteration of the first decoding technique.

18. The system of claim 11, wherein:
the LDPC codeword comprises a plurality of symbols each associated with a plurality of check nodes, and wherein the processing circuitry is further configured to:
decode a first group of symbols of the plurality of symbols of the LDPC codeword using the first iteration of the first decoding technique; and
decode a second group of symbols of the plurality of symbols of the LDPC codeword, different from the first group of signals, using second iteration of the first decoding technique.

19. The system of claim 11, wherein the processing circuitry is further configured to:
perform a correction for different noise realizations by the first decoding technique defined and the second decoding technique.

20. The system of claim 11, wherein the processing circuitry is further configured to:
modify the threshold syndrome weight that was used for the first decoding technique and based on the second decoding technique, before the first iteration of the second decoding technique.

* * * * *